(12) United States Patent
Mo et al.

(10) Patent No.: US 7,650,560 B2
(45) Date of Patent: Jan. 19, 2010

(54) PACKET TRANSMISSION APPARATUS AND METHOD USING OPTIMIZED PUNCTURED CONVOLUTION CODES

(75) Inventors: Shaomin Samuel Mo, Monmouth Junction, NJ (US); Alexander D. Gelman, Smallwood, NY (US)

(73) Assignee: Panasonic Corporation, Osaka (JP)

( * ) Notice: Subject to any disclaimer, the term of this patent is extended or adjusted under 35 U.S.C. 154(b) by 551 days.

(21) Appl. No.: 11/395,920

(22) Filed: Mar. 31, 2006

(65) Prior Publication Data

US 2007/0234186 A1    Oct. 4, 2007

(51) Int. Cl.
*H03M 13/03* (2006.01)
(52) U.S. Cl. .................. 714/790; 714/748; 714/749
(58) Field of Classification Search .......... 714/790, 714/18, 748, 749; 370/253, 252
See application file for complete search history.

(56) References Cited

U.S. PATENT DOCUMENTS

| | | | | |
|---|---|---|---|---|
| 5,828,677 A * | 10/1998 | Sayeed et al. | ............... | 714/774 |
| 2003/0110436 A1 | 6/2003 | Von Elbwart et al. | | |
| 2003/0120990 A1 | 6/2003 | Elbwart et al. | | |
| 2004/0010736 A1* | 1/2004 | Alapuranen | ................. | 714/100 |
| 2004/0081103 A1* | 4/2004 | Sebire | ........................ | 370/253 |
| 2004/0114549 A1 | 6/2004 | Miyoshi et al. | | |
| 2005/0050432 A1 | 3/2005 | Chen et al. | | |
| 2006/0064627 A1* | 3/2006 | Berens et al. | ............... | 714/790 |

OTHER PUBLICATIONS

Reed Fisher et al., DS-UWB Physical Layer Submission to 802.15 Task Group 3a, IEEE P802.15-04/0137r3, IEEE P802.15 Working Group for Wireless Personal Area Networks (WPANs), pp. 1-26, Jul. 2004.
Samir Kallel et al., Throughput Performance of Memory ARQ Schemes, IEEE Transactions on Vehicular Technology, pp. 891-899, vol. 48, No. 3, May 1999.
Samir Kallel; Analysis of a Type II Hybrid ARQ Scheme with Code Combining; IEEE Transactions on Communications, pp. 1133-1137, vol. 38, No. 8, Aug. 1990.
Anuj Batra et al., Multi-band OFDM Physical Layer Proposal, pp. 1-46, IEEE802.15-03/267r5, Jul. 2003.

* cited by examiner

*Primary Examiner*—Guy J Lamarre
*Assistant Examiner*—Sam Rizk
(74) *Attorney, Agent, or Firm*—RatnerPrestia

(57) ABSTRACT

A method of communication between or among a plurality of devices in a communication system using one or more frames to transmit a plurality of bits includes encoding the plurality of bits in accordance with a first puncture code in a first device of the plurality of devices, transmitting the plurality of encoded bits to a second device of the plurality of devices, and determining in the first device an error condition indicated in a received acknowledgement from the second device. When the error condition indicates a first error code, retransmitting the encoded bits in accordance with the first puncture code, and when the error condition indicates another error condition, different from the first error code, encoding the plurality of bits in accordance with a second puncture code, different from the first puncture code and transmitting the plurality of encoded bits to the second device.

30 Claims, 14 Drawing Sheets

PACKET TRANSMISSION APPARATUS AND METHOD USING OPTIMIZED PUNCTURED CONVOLUTION CODES

FIELD OF THE INVENTION

The present invention relates to the field of wireless communications and, more particularly, to a method of transmission using punctured codes.

BACKGROUND OF THE INVENTION

Ultra Wideband (UWB) technology uses base-band pulses of very short duration to spread energy of transmitted signals very thinly from near zero to several GHz. This technology is presently in use in military applications. Commercial applications will soon become possible due to a Federal Communications Commission (FCC) decision that permits the marketing and operation of consumer products incorporating UWB technology.

Presently, UWB is under consideration by the Institute of Electrical and Electronic Engineers (IEEE) as an alternative physical layer technology. See IEEE Standard 802.15.3a, which is designed for home wireless audio/video systems. This standard sets forth that UWB systems should operate well in an environment of uncoordinated piconets. Piconets, sometimes referred to as personal area networks (PANs), are formed when at least two devices, such as a portable PC and a cellular phone, connect.

A common technique in communication systems, with unreliable channel conditions is to correct errors based on a combination of Automatic Repeat Request (ARQ) schemes and Forward Error Correction (FEC) techniques. Such a combination is generally known as hybrid ARQ (HARQ) techniques and may include error detection, FEC and retransmission. Convolutional codes are widely used in wireless systems to correct errors. Moreover, puncture codes are known in the communications art to generate codes of various data rates.

SUMMARY OF THE INVENTION

The present invention is embodied (1) as a computer readable medium including software that is configured to control a general purpose computer to implement a method; and (2) as the method thereof for communication between or among a plurality of devices in a communication system using one or more frames to transmit a plurality of bits. The method includes encoding the plurality of bits in accordance with a first puncture code in a first device of the plurality of devices, transmitting the plurality of encoded bits to a second device of the plurality of devices, determining in the first device an error condition indicated in a received acknowledgement from the second device, when the error condition indicates a first error code, retransmitting the encoded bits in accordance with the first puncture code, and when the error condition indicates another error code, different from the first error code, encoding the plurality of bits in accordance with a second puncture code, different from the first puncture code and transmitting the plurality of encoded bits in accordance with the second puncture code to the second device.

The present invention may be further embodied as a device for communicating between or among a plurality of other devices in a communication system using one or more frames to transmit a plurality of encoded bits. The device includes means for selecting a puncture code to be used to encode the plurality of bits, an encoding unit for encoding the plurality of bits according to the selected puncture code, a transmitter for transmitting the plurality of encoded bits, and a receiver for receiving acknowledgements of respective transmissions of the plurality of encoded bits. When the means for selecting the puncture code determines that an error code in a received acknowledgement indicates a first error condition, the means for selecting the puncture code selects a first puncture code to encode the plurality of bits and when the error code indicates an other error condition, different from the first error condition, the means for selecting the puncture code selects a second puncture code to encode the plurality of bits.

The present invention may be further embodied as a method of communicating between or among a plurality of devices in a communication system using one or more frames to transmit from a first device a plurality of encoded bits. The method includes receiving, from the first device, a respective frame including the plurality of bits encoded in accordance with a first puncture code, processing in a second device the received respective frame to determine whether an error condition is indicated therein. When the processing indicates a first error condition related to information about a length of the respective frame and/or a data rate used to encode the plurality of bits, transmitting from the second device a first acknowledgement message including a first error condition indicator, and when the processing indicates an error condition related to other error conditions different than the first error condition, transmitting from the second device a second acknowledgment message including a second error condition indicator different from the first error condition indicator.

The present invention may be further embodied as a method of communicating between or among a plurality of devices in a communication system. At least a portion of the plurality of devices in the communication system transmit variable length frames in accordance with an established reservation. Each respective frame includes at least information indicating a length of the respective frame. The method includes generating a plurality of bits of the respective frame, encoding the plurality of bits in accordance with a first puncture code in a first device of the plurality of devices, transmitting the plurality of encoded bits to a second device of the plurality of devices, when a received acknowledgement from the second device indicates unsuccessful processing of information about the length of the respective frame, retransmitting the encoded bits in accordance with the first puncture code, and when the received acknowledgement from the second device indicates other unsuccessful processing of the respective frame, encoding the plurality of bits in accordance with a second puncture code and transmitting the encoded plurality of bits that are encoded in accordance with the second puncture code.

The present invention may be further embodied as a method of communicating between or among a plurality of devices in a communication system. The method includes encoding in a first device a plurality of bits representing a communication in accordance with N puncture codes, where N is an integer, and transmitting to a second device the plurality of encoded bits using respective puncture codes of the N puncture codes. Each of the N puncture codes have a substantial equal number of bits for transmission to reduce bandwidth of the communication system.

BRIEF DESCRIPTION OF THE DRAWINGS

The invention is best understood from the following detailed description when read in connection with the accompanying drawings. It is emphasized that, according to common practice, various features/elements of the drawings may not be drawn to scale. On the contrary, the dimensions of the various features/elements may be arbitrarily expanded or reduced for clarity. Moreover in the drawings, common numerical references are used to represent like features/elements. Included in the drawing are the following figures.

DETAILED DESCRIPTION OF THE INVENTION

Although the invention is illustrated and described herein with reference to specific embodiments, the invention is not intended to be limited to the details shown. Rather, various modifications may be made in the details within the scope and range of equivalents of the claims and without departing from the invention.

Although the present invention is described in terms of UWB communication systems, the present invention may be applied to other communication systems using retransmission techniques with Automatic Retry Request (ARQ) and Hybrid ARQ (HARQ) techniques. For example, it is contemplated that embodiments of the present invention may be applicable generally to a communication system with variable length packets. In such a system using proper selection of puncture codes, the composite data rate for multiple transmissions can be reduced. Moreover bandwidth requirement can be reduced by balancing the number of transmitted bits between various transmissions.

Figure 1:
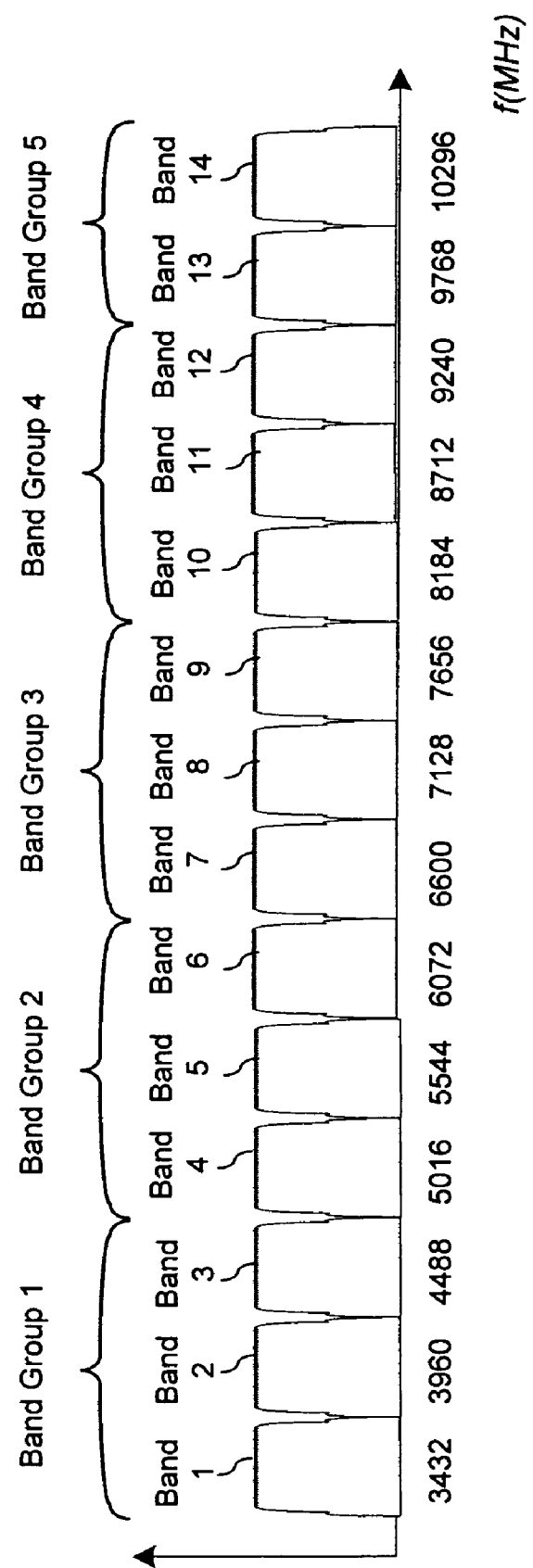
FIG. 1 (Prior Art) is a conceptual representation of a multi-band spectrum allocation for a UWB communication system.

FIG. 1 is a conceptual representation of a multi-band spectrum allocation for a UWB communication system which is in accordance with FCC mandates for such systems. The UWB spectrum of 7.5 GHz in the 3.1 GHz to 10.6 GHz frequency band is divided into 14 bands and each of bands 1-14 occupies 528 MHz of bandwidth. Bands 1-14 are grouped into band groups 1-5. For devices using UWB communications support for band group 1 is mandatory while it is optional for band groups 2-5.

Figure 2:
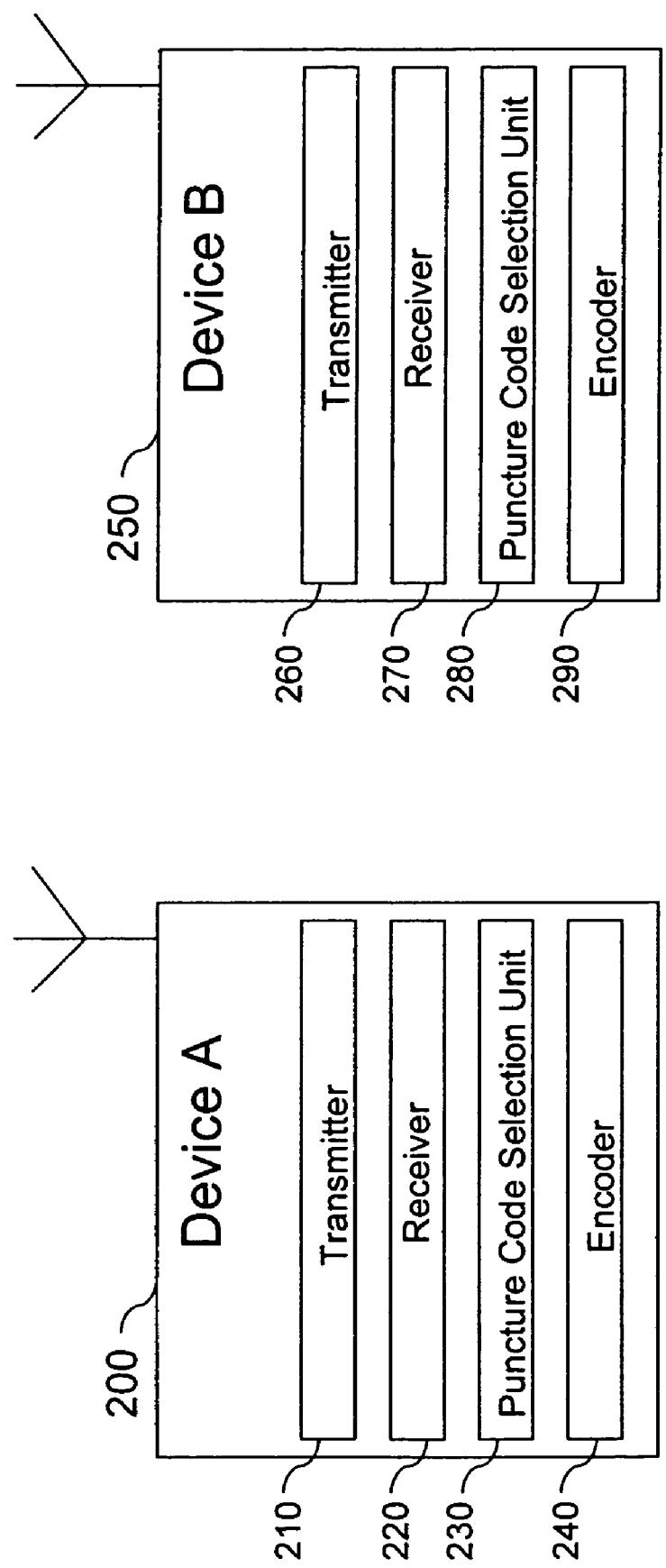
FIG. 2 is an illustration of a grouping of UWB devices used in a UWB communication system in accordance with exemplary embodiments of the present invention.

FIG. 2 is a grouping of UWB devices used in a UWB communication system in accordance with certain exemplary embodiments of the present invention.

Referring now to FIG. 2, each UWB device 200 and 250 may include a transmitter 210 and 260, respectively, to transmit communications (e.g., a plurality of encoded bits) to other UWB devices, and a receiver 220 and 270, respectively, to receive respective communications (e.g., acknowledgements of transmissions of the plurality of encoded bits) from other UWB devices.

Each UWB device 200 and 250 may further include: (1) a puncture code selection unit 230 and 280, respectively, to select a puncture code to be used to encode a plurality of bits to be transmitted; (2) a convolution encoder 240 and 290, respectively, to encode the plurality of bits according to the selected puncture code; and the transmitter which transmits the plurality of encoded bits in accordance with the selected puncture code selected by the puncture code selection unit.

Although separate units are illustrated for the encoder selection unit, the encoder unit in the transmitter and the receiver, it is contemplated that one or more of these units may be encompassed in a processor.

When the puncture code selection unit 230 and 280 or the processor determines that an error code in a received acknowledgement indicates a first error condition, the puncture code selection unit 230 and 280 or the processor selects a first puncture code to encode the plurality of bits and when the error code indicates an other error condition, different from the first error condition, the puncture code selection unit 230 or the processor selects a second puncture code to encode the plurality of bits.

The first error condition may be an error related to information provided in a respective frame about a length of a respective frame and/or a data rate used to encode the bits in the respective frame.

The puncture code selection unit 230 and 280 or the processor (1) may select the second puncture code such that at least one different encoded bit is included in the transmitted plurality of bits encoded with the second puncture code relative to the transmitted plurality of bits encoded with the first puncture code; (2) may select the second puncture code based on the first puncture code; (3) may select the second puncture code such that at least one common encoded bit is included in the transmitted plurality of bits encoded with the second puncture code relative to the transmitted plurality of bits encoded with the first puncture code; (4) may select the second puncture code such that bits encoded in accordance with the first puncture code are complimentary to bits encoded in accordance with the second puncture code; and/or (5) may select a further puncture code, different from the first or second puncture code, in accordance with a number of times an error condition, other than the first error condition, has been indicated in respective received acknowledgements.

When the receiver receives a further acknowledgement, the puncture code selection unit 230 and 280 or the processor may determine whether the further acknowledgement indicates the first error condition. If so, the transmitter may retransmit the plurality of bits encoded in accordance with the first puncture code and if the further acknowledgement indicates an other error condition, different from the first error condition, the puncture code selection unit 230 and 280 or the processor may select a further puncture code to encode the plurality of bits and may transmit the plurality of bits encoded in accordance with the further puncture code.

Although 2 UWB devices 200 and 250 are shown any number of devices may be included in the UWB communication system.

Figure 3:
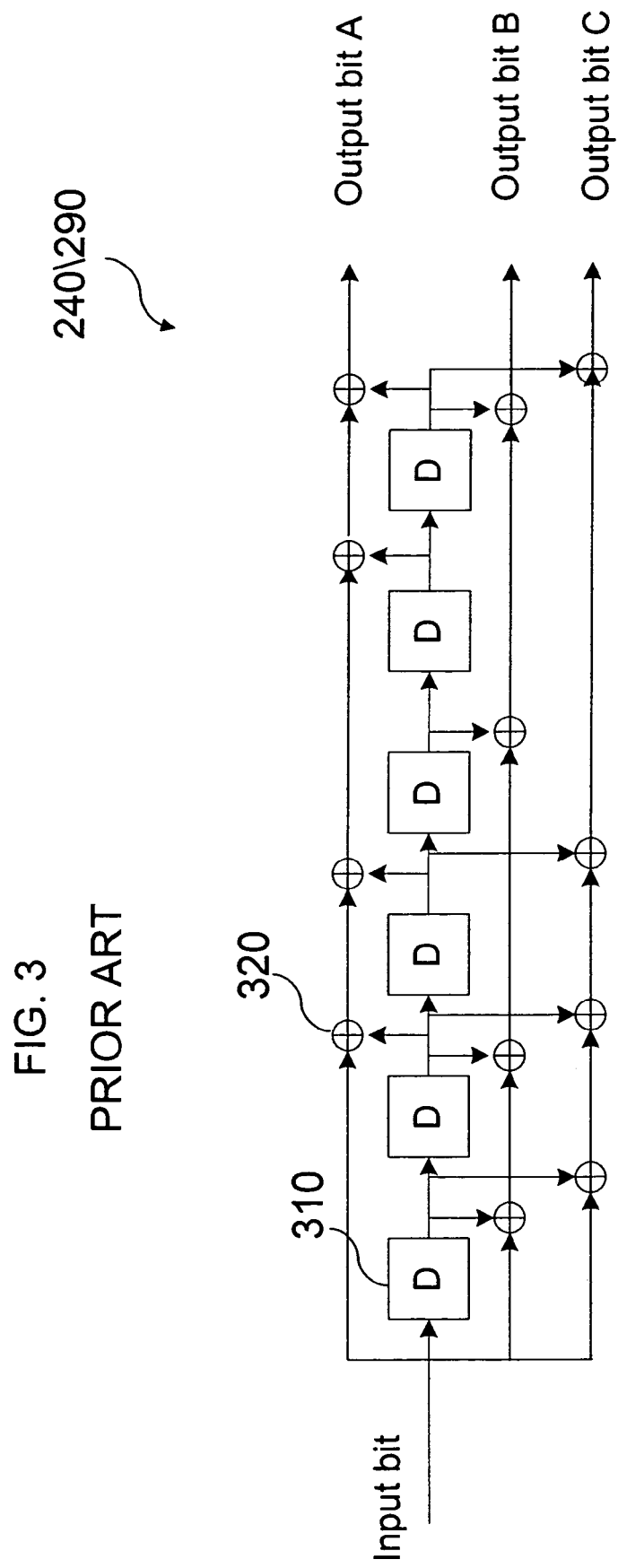
FIG. 3 (Prior Art) is a block diagram illustrating a conventional convolutional encoder.

FIG. 3 is a block diagram illustrating an exemplary convolutional encoder 240 or 290.

The exemplary encoder 240 and 290 may be used in FEC and is shown in FIG. 3 having a constraint length of K=7. It is contemplated that encoders with other constraint lengths maybe used. Convolutional encoder 240 and 290 may include delay elements 310 and summers 320, for example, to perform modulo 2 addition. For each summer 320, the delay elements 310 may be selected based on a polynomial. The code (data) rate, which refers to the ratio of input bits to output bits, for convolutional encoder 240 and 290 is ⅓. That is, for each input bit convolutional encoder 300 provides 3 output bits.

Although an encoder is shown which has a ⅓ code rate (or data rate), (i.e. R=⅓), any number of other code rates are possible. For example, industry-standard generator polynomials include $g_0=133_g$, $g_1=165_g$, and $g_2=171_g$. The bit denoted as "A" is the first output bit generated by convolutional encoder 300, followed by the output bit denoted as "B", and finally, by the output bit denoted as "C". Various coding rates may be derived from the R=⅓ convolutional code by using "puncturing" techniques.

It should be understood that the methods illustrated may be implemented in hardware, software, or a combination thereof. In such embodiments, the various components and steps described below may be implemented in hardware and/or software. For example, conventional encoder 300 may be implemented in hardware, software or a combination thereof.

Receivers may transmit acknowledgement messages to transmitters to indicate whether received frames are correctly demodulated. There are three different types of acknowledgements i.e., no acknowledgment (No-ACK), immediate acknowledgement (Imm-ACK) and block acknowledgement (B-ACK).

In the materials that follow, data transmissions are referenced by the type of acknowledgement they report. For example, a B-ACK frame is a data frame that requires a back acknowledgement.

No-ACK refers to a transmitted frame with an ACK policy field that is set to indicate that the transmitted frame shall not be acknowledged by an intended recipient or recipients (i.e., the one or more reception devices). The transmission device assumes that the frame is successful for all its local management entities (e.g., devices within its range) and proceeds to the next frame scheduled for transmission without waiting for any acknowledgment from the recipient device. The ACK policy field in broadcast and multicast addressed frames may be set to no-ACK upon transmission.

Imm-ACK refers to a transmitted frame with an ACK Policy field that is set to indicate that the transmitted frame shall be immediately acknowledged by an intended recipient. If the intended recipient of the frame correctly receives the frame, it shall send, (i.e., transmit) the Imm-ACK frame.

B-ACK refers to a transmitted frame within a block of transmitted frames. These transmitted frames each have an ACK Policy field that is set to indicate that the respectively transmitted frame shall be block acknowledged by an intended recipient. That is, if the intended recipient of the frame correctly receives all or some of these transmitted frames, it shall send, (i.e., transmit) the B-ACK frame to acknowledge which ones of these transmitted frames were correctly received after the last transmitted frame of the block.

Figure 4:
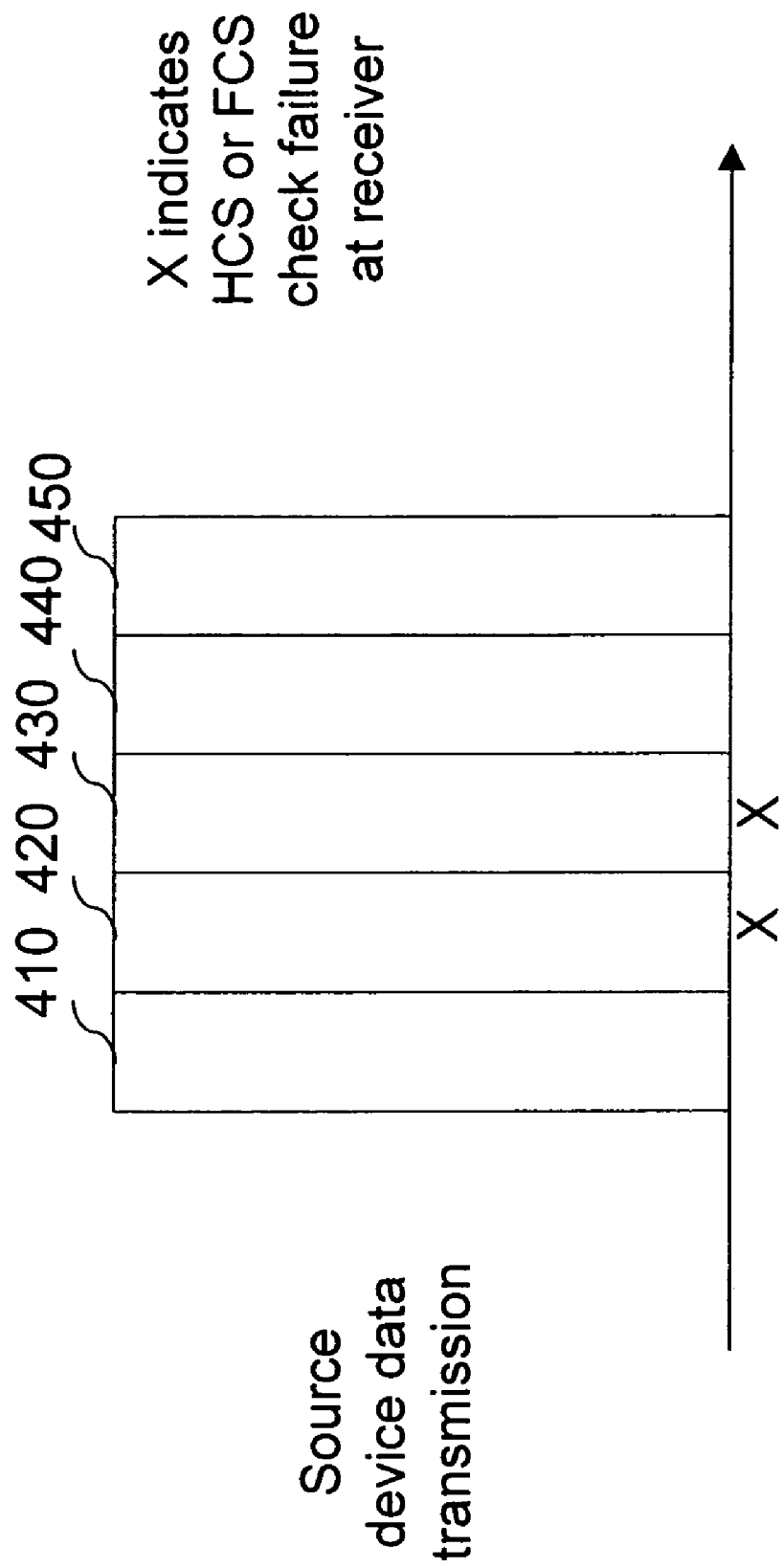
FIG. 4 is a timing diagram illustrating Block Acknowledgement (B-ACK) frames.

FIG. 4 is a timing diagram illustrating B-ACK messages from a UWB device.

Now referring to FIG. 4, a series of B-ACK frames 410, 420, 430, 440 and 450 may be transmitted from a source device to a recipient device. Some of the frames may include a B-ACK request. If an Acknowledgement (ACK) is not received by the source device from the recipient device when requested by the source device, the last frame of the burst transmission, i.e., B-ACK frame 450, the B-ACK request may be repeated until the ACK frame is received by the source device. The source device may transmit (send) an empty data frame which is not in the original burst transmission, as an alternative to retransmitting (resending) the last B-ACK frame 450, under the condition that the total number of B-ACK frames, including empty frames, does not exceed a threshold number of frames (i.e., Max Frames). The source device may not start or resume burst transmissions until an ACK frame is received by the source device.

B-ACK frame 450 transmitted by the source device may require an acknowledgment, while the acknowledgement of other B-ACK frames 410, 420, 430 and 440 may be optional. An X illustrated below B-ACK frames 420 and 430 denotes that these B-ACK frames 420 and 430 have errors (e.g., a Cyclic Redundancy Check (CRC) error) found by the recipient device upon reception, but the error does not distinguish whether it is a header check sum (HCS) error or a frame check sum (FCS) error. B-ACK frames may be provided to reduce ACK times for burst transmission and may allow a source device to transmit multiple frames and to receive a single respective acknowledgment from the recipient device indicating which B-ACK frames were successfully received and/or which B-ACK frames are to be retransmitted. B-ACK frames may be used for directed stream data frames, i.e., isochronous connections, where the B-ACK operation is set up with negotiation between source and recipient devices. Source and recipient devices may negotiate about the maximum number of B-ACK frames.

Figure 5:
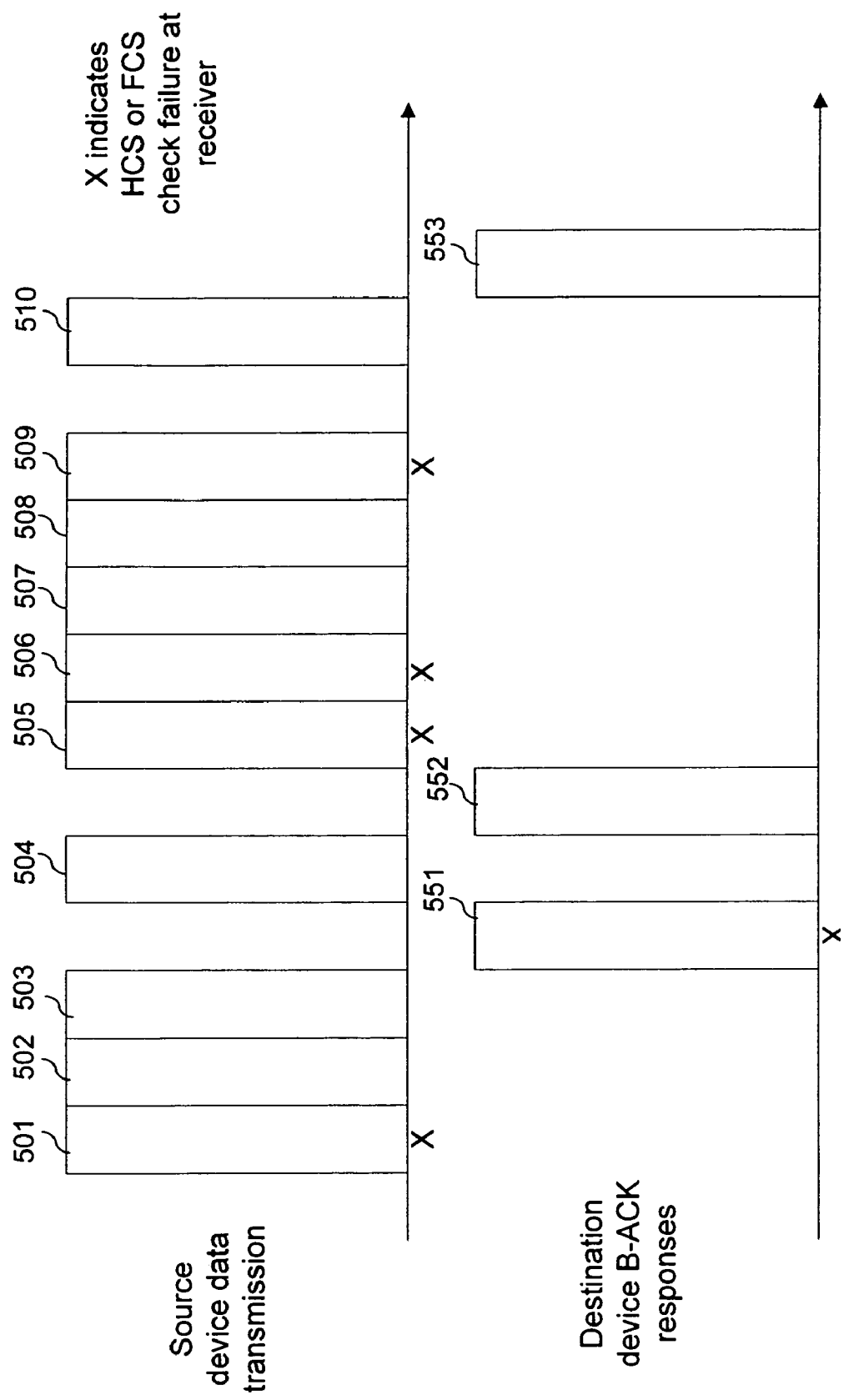
FIG. 5 is a timing diagram illustrating a series of block acknowledgment transmissions between UWB devices.

FIG. 5 is a timing diagram illustrating a series of B-ACK frame transmissions between UWB devices.

Now referring to FIG. 5, a series of B-ACK frames 501, 502 and 503 may be transmitted (i.e., burst transmitted) from a source device to a recipient device. That is, B-ACK frames 501, 502 and 503 may form a block with a B-ACK request associated with the transmission of the last B-ACK frame 503 of the series. An X below B-ACK frame 501 denotes that the transmission from the source device to the recipient device for B-ACK frame 501 is corrupted. That is, for example, the recipient device either does not receive B-ACK frame 501 or, otherwise, does not receive a validated B-ACK frame 501 (e.g., validated by one or more CRCs in the recipient device). In such a case, the recipient device does not send a positive acknowledgement of a successful transmission of B-ACK frame 501.

On the other hand, the transmission of B-ACK frames 502 and 503 may be successful and an ACK 551 indicating successful receipt of B-ACK frames 502 and 503 may be sent from the recipient device. However, if ACK 551 is not properly received (i.e., is a lost or corrupted transmission) by the source device, the source device may continuously retransmit the last transmitted B-ACK frame 503, for example as B-ACK frame 504, until it receives a successfully transmitted ACK, in this case ACK 552. ACK 552 acknowledges successfully receipt of B-ACK frames 502 and 503.

Moreover, the source device may wait for the positive acknowledgement that respective B-ACK frames 501, 502 and 503 have been properly received (i.e., received by recipient device and validated by the one or more CRCs). If a positive acknowledge of one or more B-ACK frames 501, 502 and 503 is not received, the source device may resend (retransmit) the one or more frames which are not positively acknowledged by the recipient device. In this exemplary transmission, B-ACK frame 501 was not positively acknowledged and is retransmitted as B-ACK frame 505. That is, if a positive acknowledgement regarding respective B-ACK frames in an ACK is not received by the source device, the source device may assume the transmission is either corrupted or lost and resend the information (i.e., the B-ACK frames).

Because B-ACK frame 501 was not acknowledged in ACK 552, the source device may retransmit the contents of B-ACK frame 501, as B-ACK frame 505 in another B-ACK transmission (burst transmission) with B-ACK frames 506, 507, 508 and 509. B-ACK frames 505, 506 and 509 are illustrated as corrupted or lost during transmission. Because B-ACK frame 509 is corrupted or lost during transmission, the recipient device does not respond with any ACK and the source device may retransmit the last B-ACK frame 509, as B-ACK frame 510. The recipient device may respond with an ACK 553 indicating successful receipt of B-ACK frames 507, 508 and 510.

It is understood, by one skilled in the art, that further B-ACK frame transmissions and ACK responses may occur in this example after ACK 510, based on the unsuccessful transmission of B-ACK frames 505 and 506.

It is further understood by one skilled in the art, that the ACK scheme may include negative acknowledgements (i.e., acknowledgements which indicate an unsuccessful transmission (and reception) of a B-ACK frame).

Figure 6:
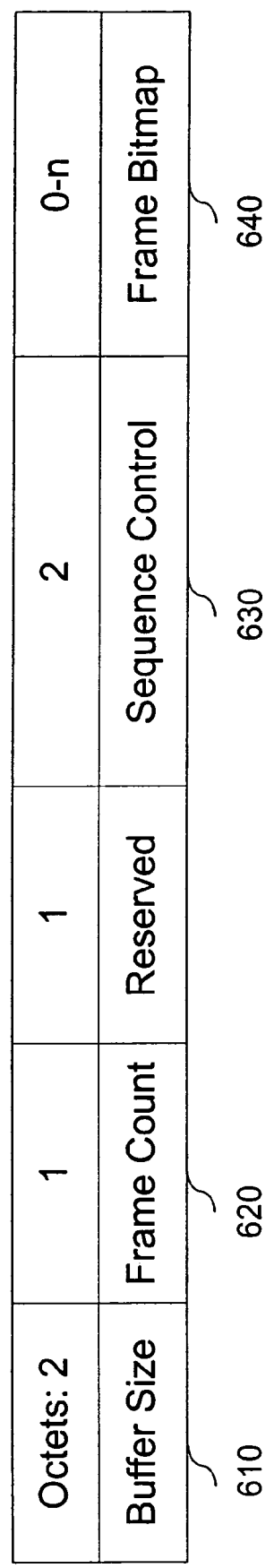
FIG. 6 is a schematic diagram illustrating a format of an exemplary B-ACK frame in accordance with certain exemplary embodiments of the present invention.

FIG. 6 is a schematic diagram illustrating a format of a B-ACK frame in accordance with certain exemplary embodiments of the present invention.

Now referring to FIG. 6, a B-ACK frame payload format is illustrated including a buffer size field 610, a frame count field 620, a sequence control field 630 and a frame bitmap field 640. Buffer size field 610 may specify a maximum number of octets in a sum of the frame payloads of all frames in the next B-ACK sequence. Frame count field 620 may specify a maximum number of frames in the next B-ACK sequence. Sequence control and frame bitmap fields 630 and 640 together may specify an acknowledgement window of frames and their reception status. Sequence control field 630 may specify the frame number that is the start of the acknowledgement window. Frame bitmap 640 may be used to indicate an acknowledgement to each frame in a block of frames (e.g., B-ACK frames 501, 502 and 503).

For all bits within the acknowledgment window, a first value (e.g., one) may indicates that the corresponding frame was not received in the prior sequence and/or a second value (e.g., zero) may indicates that the corresponding frame was received in the prior sequence.

Figure 7:
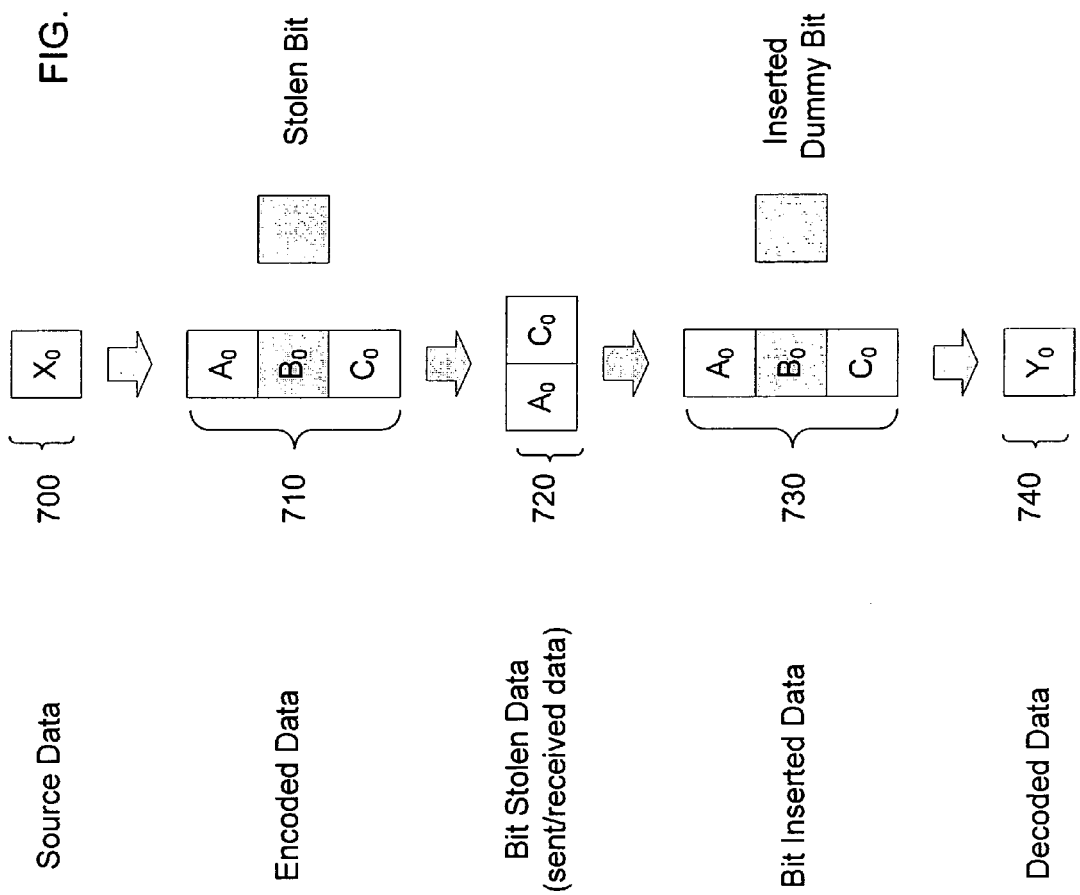
FIGS. 7, 8 and 9 are diagrams illustrating exemplary encoding methods using puncture codes which may be used in various embodiments of the present invention.
Figure 8:
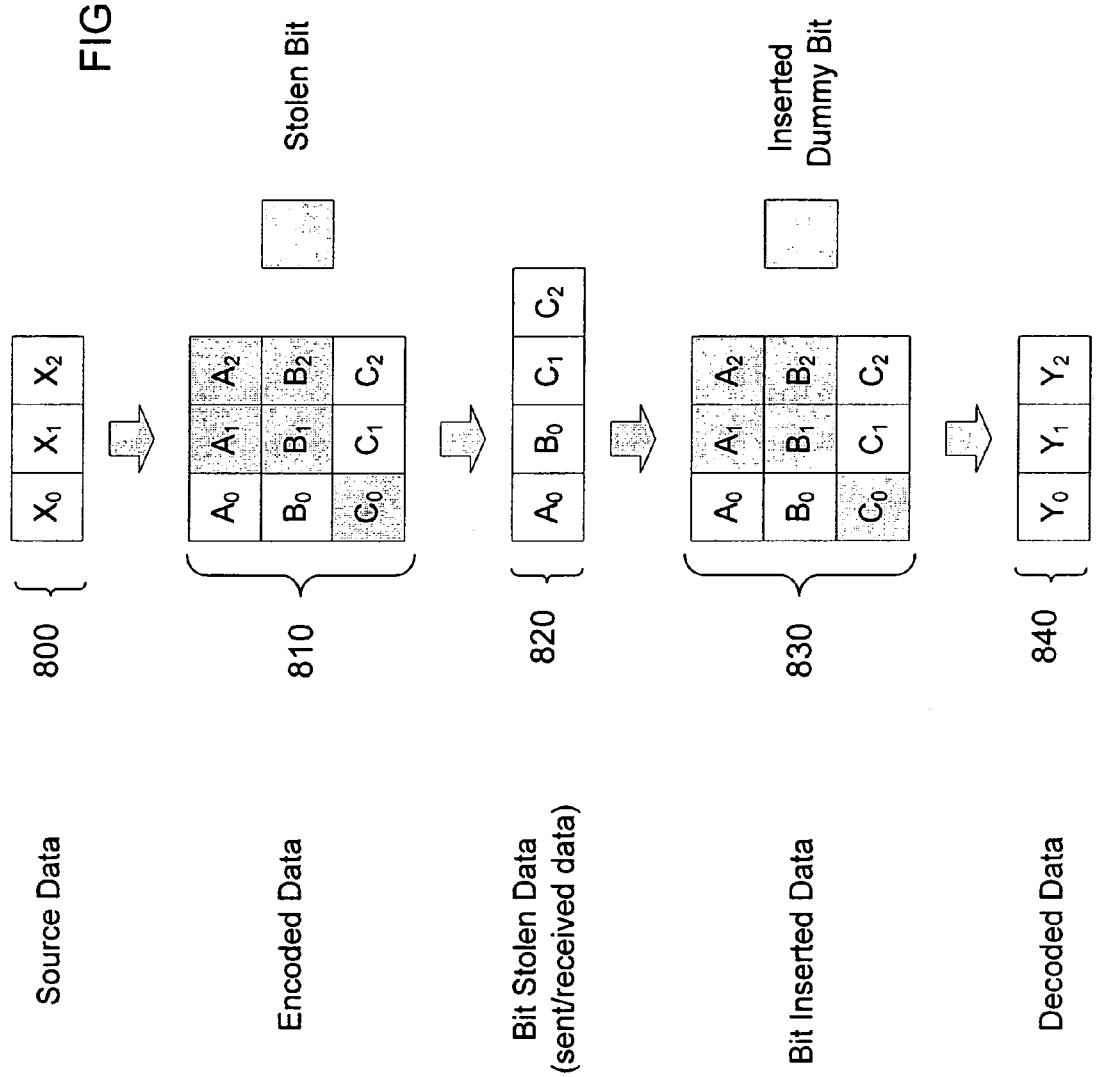
Figure 9:
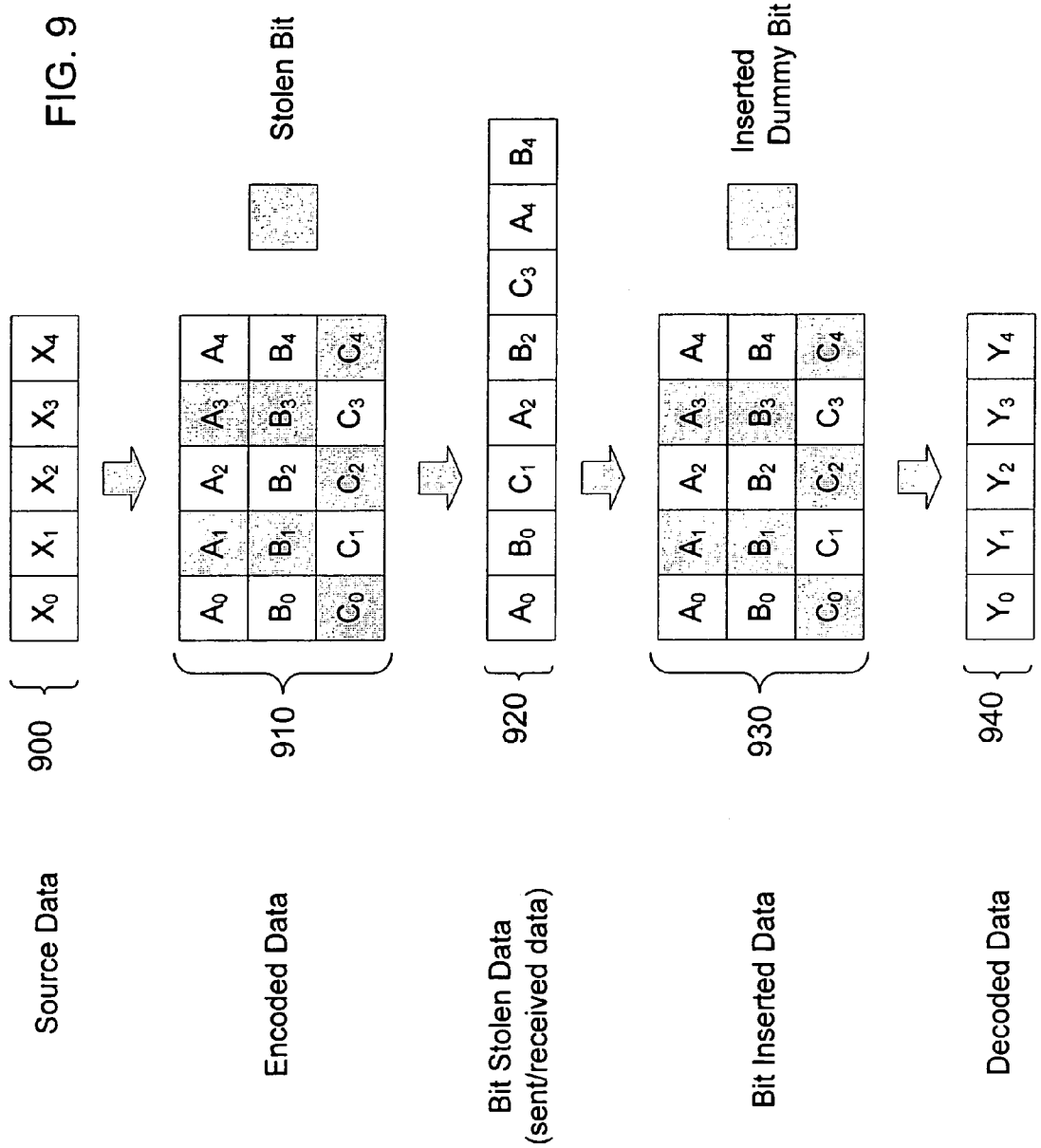

FIGS. 7-9 are diagrams illustrating exemplary encoding methods using puncture codes which may be used in various embodiments of the present invention.

Encoding using puncture codes refers to a systematic deletion of one or more bits (e.g., information bits or parity coordinates) in a code word (stream of information bits). That is, with an encoder using puncture codes, higher data rate codes may be achieved by periodically deleting bits from one or more of the encoder output streams.

In FIGS. 7-9, the output bits from, for example, conventional encoder 300 are matched to puncture codes (or patterns) as illustrated. That is, an output sequence of encoder 300 with a data rate of ⅓ prior to being punctured (i.e., further encoded) may have output bits $A_0, B_0$ and $C_0 \ldots A_n, B_n$ and $C_n$. However, other sequences are possible for example, if the data rate is ¼ prior to being punctured (i.e., further encoded), the output bits include $A_0, B_0, C_0$ and $D_0 \ldots A_n, B_n, C_n$ and $D_n$ for example.

Although it is shown that the bits are encoded using a conventional encoder 300 and further encoded using puncture codes, it is contemplated that according to embodiments of the invention, encoding may occur in a single process which includes conventional encoding and encoding using puncture codes.

Now referring to FIGS. 7-9, source data 700, 800 and 900 in, for example, UWB device 200 may be encoded using, for example, encoder 300 to produce encoded data 710, 810 and 910, respectively. Different puncture codes (or puncture patterns), as illustrated in FIGS. 7-9, respectively, may be used to puncture (to further encode) the encoded data. That is, as illustrated in FIG. 7, encoded bit $B_0$ (i.e., one or more information bits) may be systematically deleted by using a puncture code "101" at 810. The remaining encoded bits $A_0$ and $C_0$ may be transmitted at 720 from UWB device 200 to UWB device 250 for example. UWB device 250 may insert a dummy bit (for example a zero, that is, not containing any information) in the transmitted encoded bit stream at a location where $B_0$ had been deleted at 730. The transmitted encoded bit stream with the dummy bit inserted may be decoded by UWB device 250 at 740. As only two bits (i.e., $A_0$ and $C_0$) are transmitted, the punctured data rate is ½ or 2 bits per input bit. This is in contrast to the original convolution encoding of ⅓ or 3 bits per input bit without using the puncture code (i.e., without further encoding using the puncture code).

In FIG. 8, source data 800 at, for example, UWB device 200 (i.e., the transmitting device) is aggregated into 3 bits (i.e., $X_0$-$X_2$) and encoded. A ⅝ puncture code of:

1 0 0
1 0 0
0 1 1 may be used to puncture (further encode) the encoded bits at 810. The punctured encoded bits (i.e., $A_0, B_0, C_1$ and $C_2$) may be transmitted at 820 to receiving device, for example UWB device 250 and dummy bits may be added at 830 to the transmitted and punctured bits at locations where bits had been deleted during the puncturing operation by the transmitting device, UWB device 200. That is, 5 dummy bits (blanks or zeros) may be added to bits $A_0, B_0, C_1$ and $C_2$ at appropriate location in the bit stream. The transmitted encoded bit stream with the dummy bits may be decoded by UWB device 250 at 840. Since only four bits (i.e., $A_0, B_0, C_1$ and $C_2$) are transmitted for 3 input bits ($X_0, X_1$ and $X_2$) the punctured data rate is ¾ or 4 output bits per 3 input bits.

In FIG. 9, source data 900 at transmitting device, for example UWB device 200, is aggregated into 5 bits (i.e., $X_0$-$X_4$) and encoded. A 7/15 puncture code of:

1 0 1 0 1
1 0 1 0 1
0 1 0 1 0 may be used to puncture the encoded bits at 910. The punctured encoded bits (i.e., $A_0, B_0, C_1, A_2, B_2, C_3, A_4$ and $B_4$) may be transmitted at 920 to receiving device, for example UWB device 250, and dummy bits (blanks or zeros) may be added at 930 to the transmitted, punctured (further encoded) bits at locations where bits had been deleted during the puncturing operation by UWB device 200. That is, 7 dummy bits may be added to bits $A_0$, $B_0$, $C_1$, $A_2$, $B_2$, $C_3$ and $A_4$ and $B_4$ at appropriate location in the bit stream. The transmitted encoded bit stream with the dummy bits may be decoded by UWB device 250 at 940. Since eight bits are transmitted for 5 input bits, the punctured data rate is ⅝ or 8 output bits per 5 input bits.

By using a common encoder and varying the data rate using a puncturing operation, complexity of the decoder may be reduced for high data rate codes. Moreover, puncture codes may be selected to provide optimal performance. Table 1 lists the puncturing codes for each data rate and their performance. In Table 1, '0' denotes that a particular bit (bit) is punctured (i.e., that the particular bit (bit) will not be transmitted and that a dummy bit may be inserted by the receiving device.

TABLE 1

Performance comparison at different rate

| | | Eb/N0(dB) @ Pe = 1e−5 | | |
|---|---|---|---|---|
| Data Rate | Puncture Code | Non-fading | 2-path Rayleigh | Rayleigh Fading |
| ⅓ | 1<br>1<br>1 | 3.398 | 4.255 | 5.194 |
| 11/32 | 11111111111<br>11111111111<br>11111111110 | 3.403 | 4.290 | 5.265 |
| ⅜ | 111<br>110<br>111 | 3.512 | 4.508 | 5.609 |
| ½ | 1<br>0<br>1 | 3.673 | 5.070 | 6.643 |
| ⅝ | 11101<br>00000<br>10111 | 4.040 | 5.981 | 8.284 |
| ¾ | 100<br>100<br>011 | 4.432 | 7.032 | 10.143 |

Table 1 illustrates the Signal-to Noise Ratio (SNR) required for a Bit Error Rate (BER) of $1 \times 10^{-5}$ for various data rates achieved with optimal single transmission puncture codes. As shown in Table 1, for example the SNR required in a non-fading communication channel is 3.398 dB for a ⅓ data rate and 4.432 dB for a ¾ data rate. Table 1 further illustrates that as the data rate increases (e.g., from ⅓ to ¾) SNR also increases to achieve the same BER.

A common technique in communication systems with unreliable channel conditions (due to, for example, Narrow Band Inference (NBI), changing signal path conditions, opened/closed door conditions, or wet conditions, among others) is to correct errors based on HARQ schemes. If an error is detected, for example, by a cyclic redundancy check (CRC), a UWB device 200 or 250 receiving a transmission (i.e., the receiver) may request a UWB device 250 or 200 transmitting to resend the erroneously received data packets, bits and/or information bits. In the receiver, retransmitted frames corresponding to the originally transmitted frame may be combined with other corresponding frames to increase SNR. A CRC refers to, for example, matching a check sum corresponding to a block of data prior to transmission with a check sum corresponding to the same block of data after the transmission. If the check sum matches the data is presumed to have been receive properly (i.e., without corruption). Otherwise, the block of information is presumed to be corrupted. The CRC is not able to correct the error (corruption) of the block of data but only establishes whether corruption of the block occurred.

Communication systems may use a single (fixed) puncture code to optimize communication efficiency for a single transmission, however, such a fixed puncture code may not be optimized for combined demodulation (of a transmission and some or all retransmissions) in HARQ systems.

It is contemplated that puncture codes may be selected for each transmission/retransmission to improve transmission performance without increasing implementation complexity.

From Table 1, a SNR over 10.143 dB for a first transmission over a Rayleigh fading channel is needed with a ¾ data rate to achieve a BER=$1 \times 10^{-5}$ using the puncture code shown in the second column of Table 2. If a second transmission is performed using the puncture code shown in the third column of Table 2 and the first and second transmitted frames are combined for decoding, the combined puncture code is shown in the fourth column of Table 2.

TABLE 2

| Number of transmission | 1 | 2 | Result of combined |
|---|---|---|---|
| Puncturing Code | 100<br>100<br>011 | 100<br>100<br>011 | 200<br>200<br>022 | where '2' denotes that the information bit or bits are transmitted by the transmission device twice and therefore received twice by the reception device, and '0' denotes the information bit is deleted (punctured) and is not transmitted. If the transmission channel does not change during the first and second transmissions, such transmissions of the same frame increases the combined SNR at the reception device by about 3 dB. Due to the increased signal energy, the SNR requirement for each subsequent transmission using the same puncture code may reduce the SNR requirement of the channel by about 3 dB. That is, the SNR requirement for the first transmission is 10.143 dB and reduces by 3 dB with each subsequent retransmission of the same puncture code.

By comparison as shown in Table 3, if the first transmission uses the same puncture code shown in Table 3, and if a second transmission is performed using the puncture code shown in the third column of Table 3 and the first and second transmitted frames are combined for decoding, the combined puncture code is shown in the fourth column of Table 3.

TABLE 3

| Number of transmission | 1 | 2 | Result of combined |
|---|---|---|---|
| Puncturing Code | 100<br>100<br>011 | 011<br>010<br>100 | 111<br>110<br>111 |

If the transmission channel does not change during the first and second transmissions, from Table 1, the combined puncture code results in a ⅜ data rate. At this data rate, the required SNR is 5.609 dB to achieve the BER of $1 \times 10^{-5}$. Compared with the previous case, this is an improvement of about 1.544 dB. Although the second puncture code is not optimal for a single transmission, the combined performance is better than an optimal puncture code which is transmitted twice.

From the examples shown above, it may be understood by one skilled in the art that for retransmissions (e.g., second and subsequent retransmissions), puncture codes may be selected to provide any number of different data rates. In certain exemplary embodiments some or all complementary bit may be transmitted to change the data rate corresponding to the first puncture code into a lower data rate. This may be accomplished without retransmitting bits that had been transmitted in the first transmission or any previous transmissions if more than two transmissions are involved.

It may be desirable to select puncture codes so that the number of bits for each transmission is balanced between or among transmissions of corresponding frames to reduce bandwidth requirements. That is, in the example shown in Table 3, four bits are transmitted for both the first and second transmissions, thus bandwidth requirements may be reduced.

Sub-optimal puncture codes may be used and may be selected, for example, based on a number of retransmissions. Tables 4 and 5 provide different implementation of puncture codes for retransmitted frames a ¾ data rate.

Table 4 shows that each transmission generates 4 information bits. These bits to be transmitted are generated in accordance with a first puncture code in the first and third transmissions and with a second puncture code in the second and fourth transmissions. The first and second puncture codes may be complimentary (i.e., the second puncture code may include all bits for transmission which are not first transmitted using the first puncture code, or may be substantially complimentary. That is, for example, when the first and second transmission have some complementary bits which lowers the data rate of the combined signal.

Because the puncture code in Table 5 results in transmitting 5 bits compared to that of Table 4, a bandwidth saving may be realized using the puncture codes of Table 4. That is, by balancing the number of transmitted bits used in first and subsequent transmissions, the bandwidth required for transmission may be reduced and/or optimized.

TABLE 4

| Number of transmission | 1 | 2 | 3 | 4 |
|---|---|---|---|---|
| Puncturing code | 100 | 011 | 100 | 011 |
| | 100 | 010 | 100 | 010 |
| | 011 | 100 | 011 | 100 |
| Result of combined | 100 | 111 | 211 | 222 |
| | 100 | 110 | 210 | 220 |
| | 011 | 111 | 122 | 222 |

TABLE 5

| Number of transmission | 1 | 2 | 3 | 4 |
|---|---|---|---|---|
| Puncturing code | 100 | 011 | 100 | 011 |
| | 100 | 011 | 100 | 011 |
| | 011 | 100 | 011 | 100 |
| Result of combined | 100 | 111 | 211 | 222 |
| | 100 | 111 | 211 | 222 |
| | 011 | 111 | 122 | 222 |

Although it is shown that the encoded information bits may be punctured such that first and second transmissions of the punctured information bits includes 4 information bits, respectively, it is contemplated that the first, second and possibly subsequent puncture codes used may be selected: (1) to provide various data rates; (2) to balance the number of information bits transmitted relative to each transmission or retransmission; and (3) to reduce and/or optimize bandwidth requirements.

Figure 10:
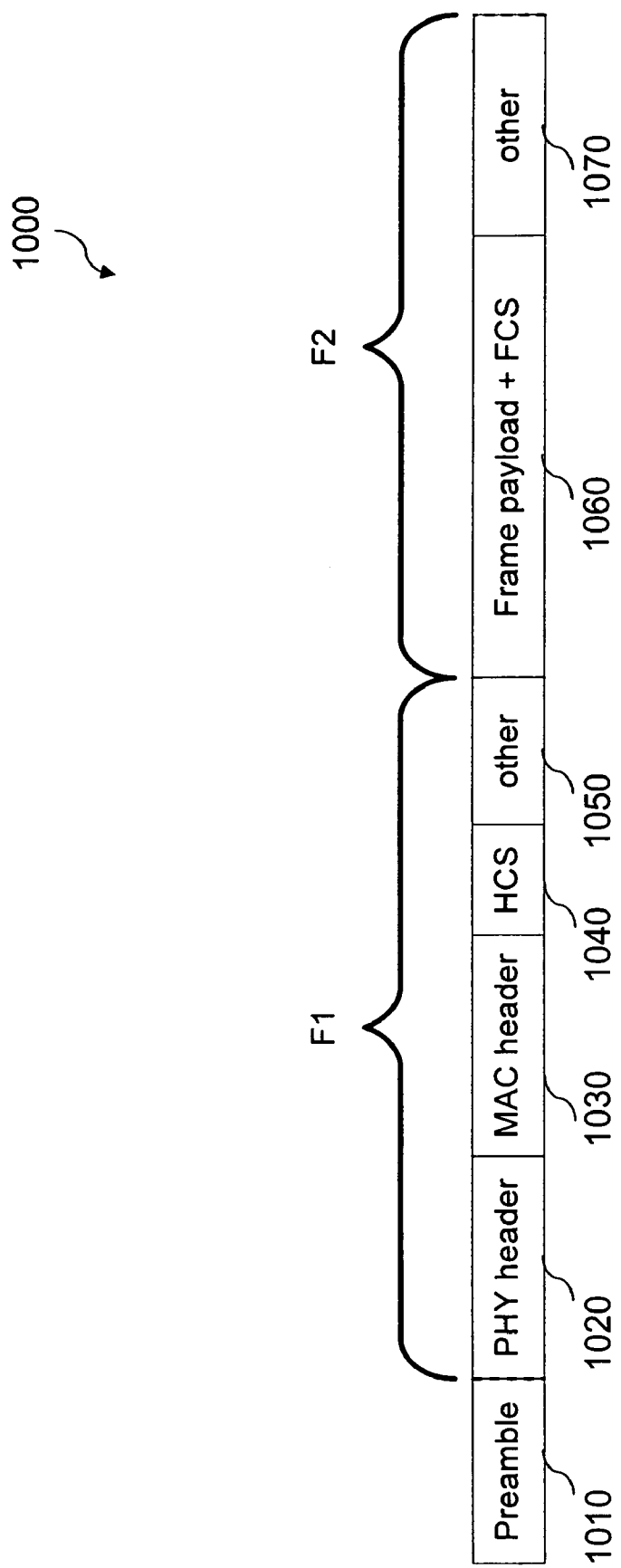
FIG. 10 is a schematic diagram illustrating a format of a frame in accordance with certain exemplary embodiments of the present invention.

FIG. 10 is a schematic diagram illustrating a format of a frame in accordance with certain exemplary embodiments of the present invention.

Now referring to FIG. 10, PHY frame format 1000 includes (1) a preamble 1010; (2) a frame header F1 having (i) a Physical Layer (PHY) header 1020, (ii) a Media Access Control (MAC) header 1030, (iii) header check sum (HCS) 1040 and (iv) other bits 1050; and (3) frame payload F2 having a payload plus a frame check sum (FCS) 1060 and other bits (i.e., tail bits and pad bits) 1070. PHY frames using the PHY frame format 1000 may be established as follows. Frame payload F2 may be passed from an upper layer to a MAC layer and then to the PHY layer with MAC header 1030 added. The PHY layer may append to Frame payload F2 and MAC header 1030, the PHY header 1020, and may calculate HCS 1040 for the combined PHY and MAC headers 1020 and 1030. The calculated HCS 1040 may be appended to the frame header F1, for example, at an end of MAC header 1030. During transmission from a UWB device 200 or 250, preamble 1010 may be transmitted first, followed by frame header F1 (e.g., PHY header 1020, MAC header 1030, HCS 1040 and other bits 1050 in sequence), then followed by frame payload F2 (e.g., payload plus FCS 1060 and other bits 1070).

PHY header 1020 may include a length of frame payload F2 for a respective frame (with or without a length of the FCS) and/or the data rate of the frame payload and FCS 1060 and other data 1070. Upon receiving each frame, for example, a receiver 220 of a first UWB device 200 may synchronize to a transmitter 260 of a second UWB device 250 via preamble 1010. Receiver 220 of UWB device 200 may validate HCS 1040, and if the received HCS 1040 match (is the same as) the calculated check sum, calculated from, for example, a Cyclic Redundancy Check (CRC) of PHY header 1020 and MAC header 1030, receiver 220 may decode frame payload F2 based on information about frame payload F2 in frame Header F1 (e.g., a data rate of frame payload F2 and/or a length of frame payload F2 which may be included in PHY header 1020, MAC header 1030 and other data 1040).

Moreover, if the FCS matches (is the same as) the calculated check sum for example, a CRC of the payload from the received frame payload F2, the respective frame may be considered to be correctly received. If either the HCS check fails or the FCS check fails, the respective frame may be treated as a failure and may be discarded or the payload may be retained to be used after retransmission to increase the SNR in an aggregated payload represented by a combination of the transmitted and retransmitted payloads, for example.

One function of preamble 1010 may be to acquire the packet and synchronize the receiver. It may include only a small amount of information relative to frame header F1 or frame payload F2 and may use a simple modulation scheme. Simple modulations schemes desirably may be less prone to channel distortion and interference. Thus, acquisition and synchronization may be able to tolerate some bit errors. Frame header F1 may include information in PHY header 1020 and MAC header 1030 which is modulated at a relatively low rate relative to that of the frame payload F2 and may or may not be protected by FEC. Any bit error may result in a different calculated HCS and cause the HCS check to fail. As a result, frame header F1 may be more prone to transmission failure and less robust than preamble 1010. Frame payload F2 includes the payload which may have a large amount of information. Sophisticated modulation schemes may be used on frame payload F2 to achieve higher channel capacity. Due to such modulation schemes, frame payload F2 is the most vulnerable to channel distortion and interference although it may be protected by the FEC.

Figure 11:
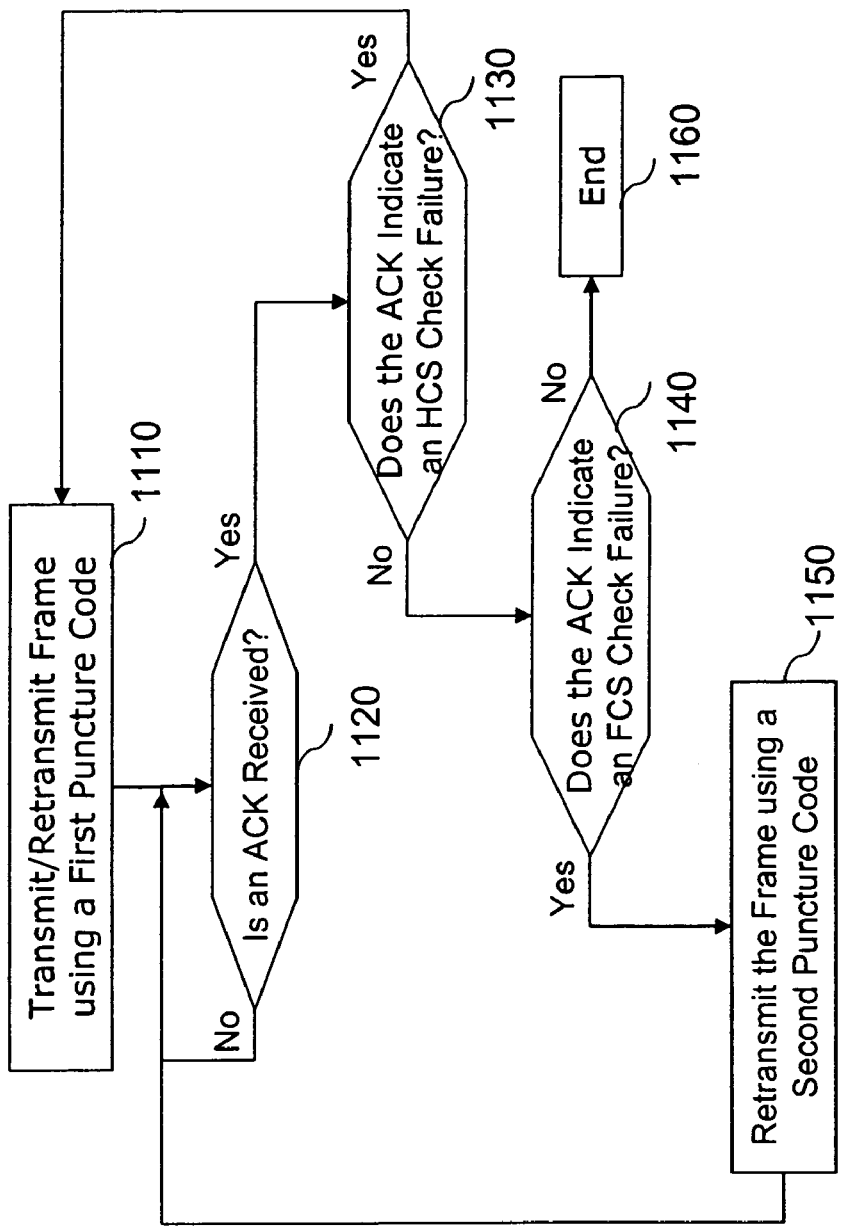
FIG. 11 is a flow chart illustrating a method of receiving a communication in accordance with an exemplary embodiment of the present invention.

FIG. 11 is a flow chart illustrating a method of receiving a communication in accordance with an exemplary embodiment of the present invention.

Now referring to FIG. 11, a first UWB device 200 for example, may transmit/retransmit a frame using a first puncture code at block 1110 to a second UWB device 250. It may be determined whether an acknowledgement (ACK) from second UWB device 250, such as a Immediate ACK (Imm-ACK) or a block ACK (B-ACK), among others, is received at block 1120. If the ACK (e.g., Imm-ACK or B-ACK) is not received from second UWB device 250, first UWB device 200 may continue to wait for receipt of the ACK from second UWB device 250 at block 1120. If the ACK is received from second UWB device 250 responsive to the transmitted/retransmitted frame, the first UWB device 200 determines whether the ACK from second UWB device 250 indicates an HCS check failure at block 1130, and, if so, first UWB device 200 retransmits (provides a subsequent transmission) of the frame using the first puncture code at block 1110. If the ACK from the second device 250 does not indicate such a HCS check failure, first UWB device 200 determines whether the ACK indicates an FCS check failure at block 1140. If the ACK indicates the FCS check failure at block 1140, the same frame is retransmitted from first UWB device 200 using a second puncture code at block 1150. In this case, the second puncture code includes different bits to be punctured than that of the first puncture code. If the frame is retransmitted at block 1150, the process is continued at block 1120. If the ACK does not indicate an FCS check failure at block 1140, processing ends at block 1160.

Figure 12:
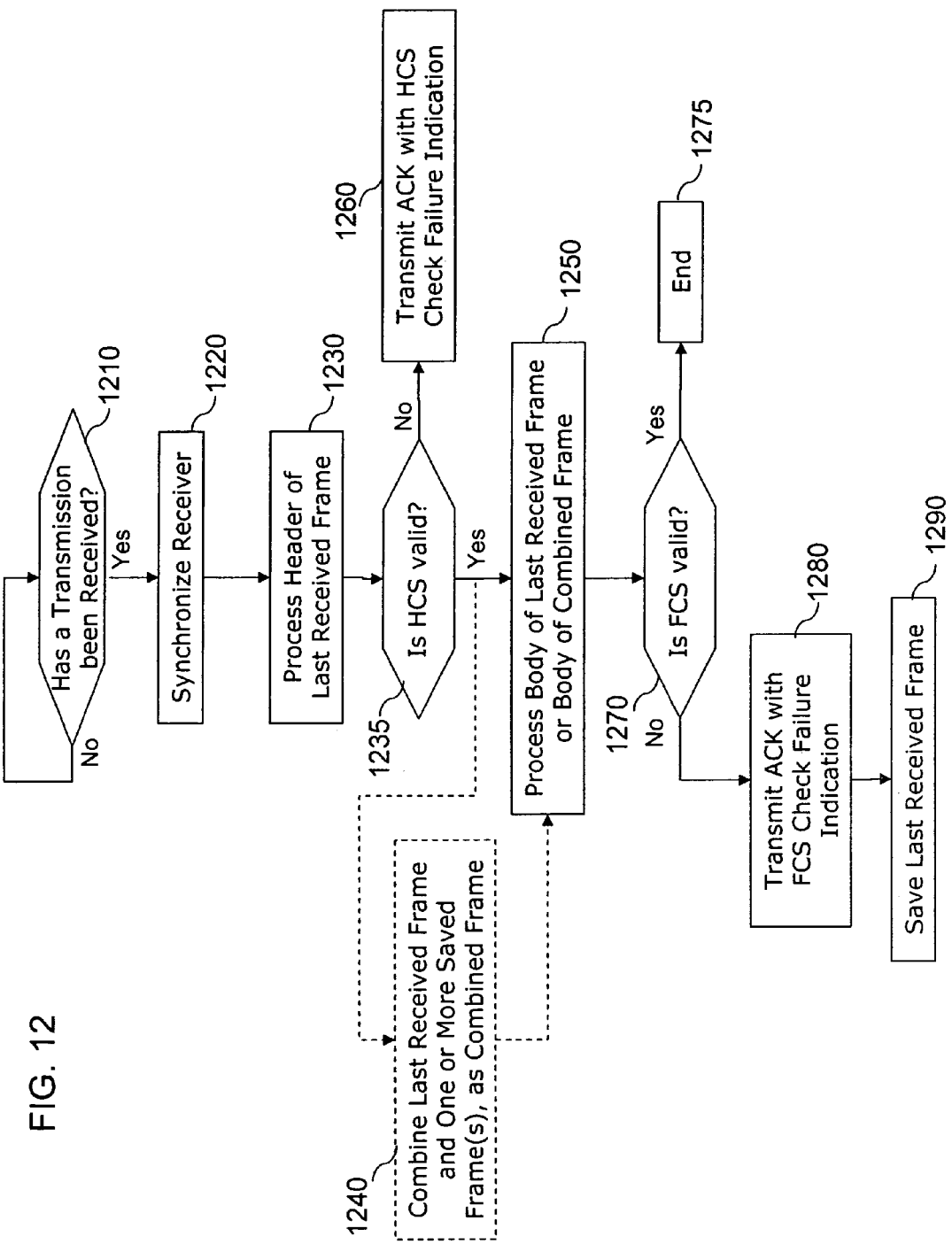
FIG. 12 is a flow chart illustrating a method of transmitting a communication in accordance with another exemplary embodiment of the present invention.

FIG. 12 is a flow chart illustrating a method of transmitting a communication in accordance with another exemplary embodiment of the present invention.

Now referring to FIG. 12, first UWB device 200 for example, may transmit/retransmit a frame using a first puncture code. Second UWB device 250 may receive the transmission/retransmission of the frame from first UWB device 200 at block 1210. If no transmission is received, second UWB device may continue to wait for receipt of a transmission at block 1210.

Receiver 270 of second UWB device 250 may synchronize itself to transmitter 210 of first UWB device 200 using preamble 1010 at block 1220. Frame header F1 of the last transmitted frame from first UWB device 200 may be processed in second UWB device 250 at block 1230.

HCS 1040 of frame header F1 may be CRC checked by matching/comparing it to a calculated HCS check sum of the PHY and MAC headers 1020 and 1030 in the second UWB device 250) to determine whether the HCS is valid at block 1235. At optional block 1240, if HCS 1040 is determined to be valid and one or more saved frame payloads representing previously transmitted versions of the same frame exist, the last transmitted frame payload and one or more saved frame payloads representing previously transmitted versions of the frame may be optionally combined to increase the SNR of the combined frame payload.

At block 1250, if the HCS is determined to be valid and (1) if no saved frame payloads exist, the frame payload F2 of the last transmitted frame may be processed; or (2) if one or more saved frame payloads representing previously transmitted versions of the frame exist, a combined frame payload of the last transmitted frame payload and one or more saved frame payloads representing previously transmitted versions of the frame may be optionally combined to increase the SNR of the combined frame payload.

At block 1260, if the HCS 1040 is determined not to be valid, transmitter 260 of second UWB device 250 may transmit an ACK indicating there is an HCS check failure as part of the ACK message content to first UWB device 200 and processing may continue at block 1210. Alternatively, if the HCS of neighboring frames of a transmission have been validated, the data rate and frame length may be determined according to one or more determined date rates and frame lengths of the neighboring frames. The then neighboring frames generally refers to one or more frames either immediately preceding or immediately following the frame having the HCS check failure associated therewith.

If the FCS is determined to be valid at block 1270, the process ends at 1275. If the FCS is determined not to be valid at block 1270: (1) transmitter 260 of second UWB device 250 may transmit an ACK with an FCS check failure indication as part of the ACK message content at block 1280; (2) the frame payload of last transmitted/retransmitted frame may be saved at block 1280, (3) first UWB device 200 may retransmit the frame using a second puncture code; and (4) processing may continue at block 1210. It is contemplated that various types of ACKs, for example Imm-ACK frames or a B-ACK frames, among others, may be transmitted during transmission between UWB devices 200 and 250, although B-ACK frames may tend to be more efficient for burst transmissions in communication systems.

Figure 13:
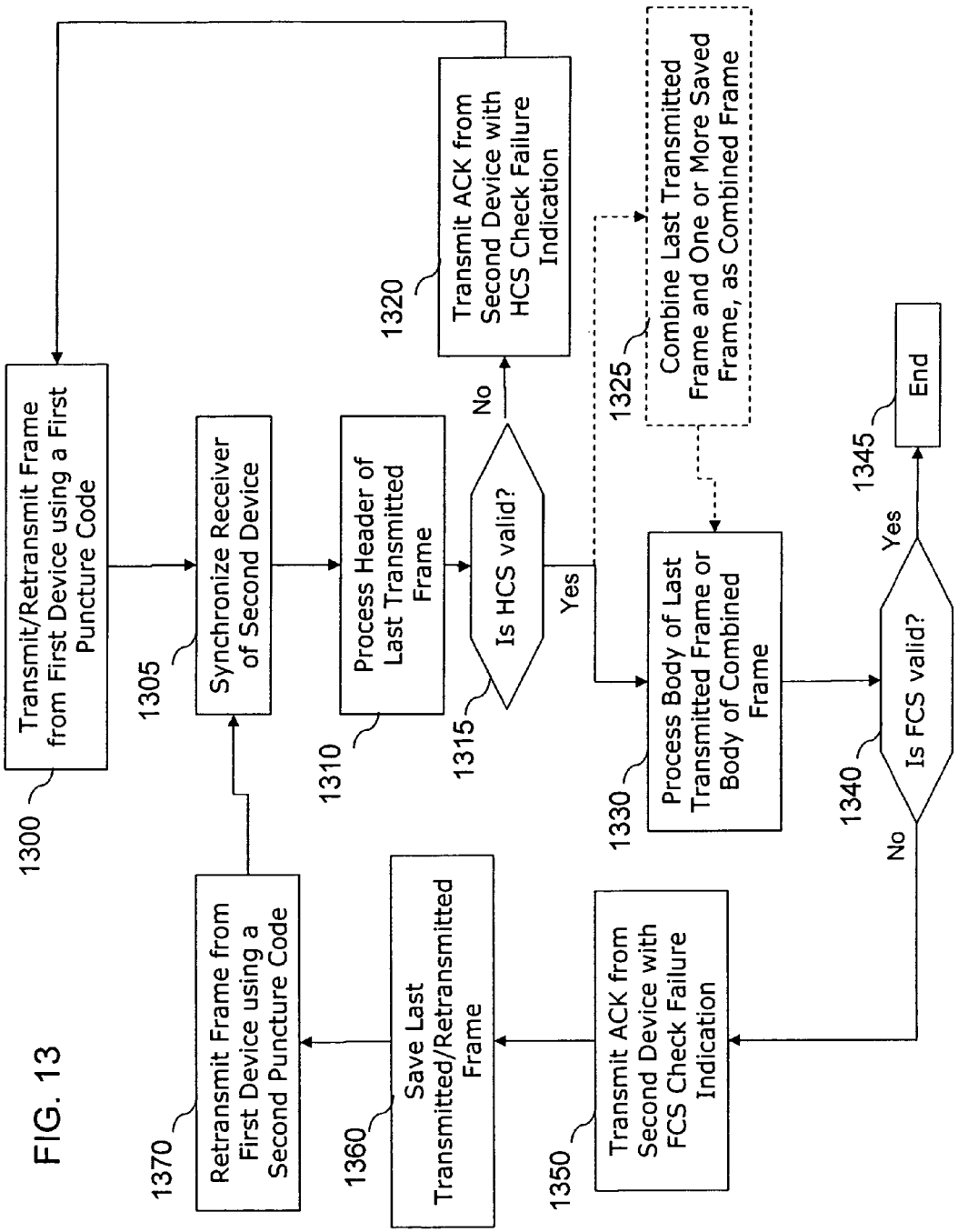
FIG. 13 is a flow chart illustrating a method of communicating between or among UWB devices in accordance with yet another exemplary embodiment of the present invention.

In certain embodiments of the present invention, an ACK message structure for each ACK message may include one or more bits indicating success or failure of transmission of the information related to the length of the respective frame and one or more bits indicating success or failure of transmission of the information related to the data rate for encoding the respective frame FIG. 13 is a flow chart illustrating a method of communicating between or among UWB devices in accordance with yet another exemplary embodiment of the present invention.

Now referring to FIG. 13, a first UWB device 200 for example, may transmit/retransmit a frame using a first puncture code at block 1300 to a second UWB device 250. Receiver 270 of second UWB device 250 may synchronize itself to transmitter 210 of first UWB device 200 using preamble 1010 at block 1305. Frame header F1 of the last transmitted frame from first UWB device 200 may be processed in second UWB device 250 at block 1310. HCS 1040 of frame header F1 may be checked (validated) in second UWB device 250 by matching/comparing the calculated check sum of PHY and MAC headers 1020 and 1030 at block 1315

If the HCS is determined not to be valid at block 1315, transmitter 260 of second UWB device 250 may transmit an ACK indicating an HCS check failure as part of the ACK message content to first device 200 at block 1320. First UWB device 200 may determine whether the ACK from second UWB device 250, such as an Imm-ACK or a B-ACK, among others, is received at block 1300. If the ACK is not received from second UWB device 250, first UWB device 200, depending on the type of ACK expected, may wait for receipt of the ACK from second UWB device 250 at 1300 or may continue to transmit one or more further frames. For example, if an Imm-ACK is expected to be received from transmitter 260 upon receipt of the last transmitted frame, first UWB device 200 may wait for the Imm ACK, or if a B-ACK is expected to be received from transmitter 260 upon receipt of a last transmitted frame, first UWB device 200 may continue transmitting one or more further frames corresponding to an entire block and then wait for the B-ACK. If the ACK received from second UWB device 250 indicates the HCS check failure, first UWB device 200 retransmits or further transmits the frame using the first puncture code at block 1300.

Thus, if the ACK is received from second UWB device 250 responsive to the transmitted/retransmitted frame at block 1300, the first UWB device 200 determines whether the ACK from second UWB device 250 indicates the HCS check failure, and, if so, first UWB device 200 retransmits (or provides a subsequent transmission of) the same frame using the first puncture code at block 1300. That is, the process starts again at block 1300.

At optional block 1325, if the HCS is valid and one or more saved frame payloads representing previously transmitted versions of the frame exist, the last transmitted frame payload and one or more saved frame payloads representing previously transmitted versions of the frame may be optionally combined to increase the SNR of the combined frame payload.

At block 1330, if the HCS is determined to be valid and (1) if no saved frame payloads exist, the frame payload F2 of the last transmitted frame may be processed; or (2) if one or more saved frame payloads representing previously transmitted versions of the frame exist, the combined frame payload of the last transmitted frame payload and one or more saved frame payloads representing previously transmitted versions of the frame combined at block 1325 may be processed.

If the FCS is determined to be valid at block 1340, the process ends at 1345. If the FCS is determined not to be valid at block 1340: (1) transmitter 260 of second UWB device 250 may transmit an ACK with a FCS check failure indication as part of the ACK message content at block 1350; (2), the frame payload of last transmitted/retransmitted frame may be saved at block 1360, (3) first UWB device 200 may retransmit the same frame using a second puncture code at block 1370; and (4) processing may continue at block 1305.

Figure 14:
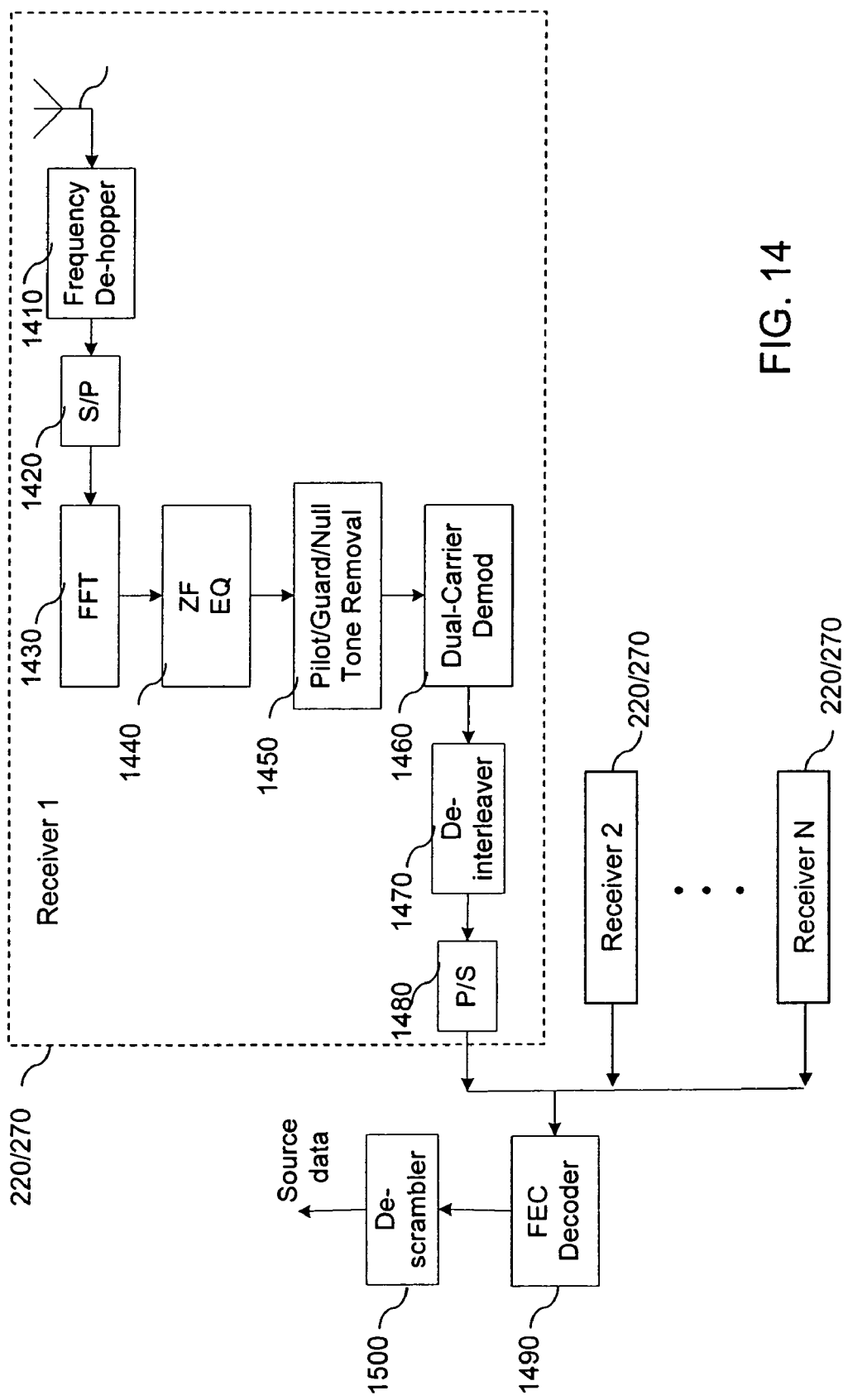
FIG. 14 is a block diagram illustrating a receiver shown in FIG. 2.

FIG. 14 is a block diagram illustrating receiver 220 or 270 shown in FIG. 3.

Now referring to FIG. 14, each receiver 220 and 270, for example, may includes an antenna 1400, a frequency de-hopper 1410, serial-to-parallel interface 1420, an FFT unit 1430, a one-tap equalizer 1440, a pilot/guard/null tone removal unit 1450, a dual carrier demodulator 1460, a de-interleaver 1470, and a parallel-to-serial interface 1480. For example, the modulated carrier transmitted by the transmitter 210 of UWB device 200 may be received at receiver 270 of UWB device 250 via antenna 1400. The frequency spreading (hopping) introduced by transmitter 210 may be de-spread by frequency de-hopper 1410. The de-spread signals from frequency de-hopper 1410 may be translated from bit serial to parallel bit signals by the serial-to-parallel interface 1420 and provided to FFT unit 1430. The FFT unit 1430 performs Fast Fourier Transformation (FFT) operations on the parallelized signals to reverse the Inverse FFT introduced by transmitter 210 to provide a constellation. If QPSK modulation is used on each tone in the constellation, channel distortion may be described as phase rotation on each carrier. To reduce or substantially eliminate such distortion, one-tap equalizers 1440 may be used on each tone. Pilot/guard/null tone removal unit 1450 may remove pilot, guard and null tones from the constellation. Dual carrier demodulator 1460 may demodulate, for example, the QPSK modulated tones after the pilot, guard and null tones are removed. De-interleaver 1470 reverses the interleaving introduced by transmitter 210. The output of the de-interleaver 1460 is passed to the parallel-to-serial interface 1480 which serializes the output. The serialized output is passed to a forward error correction (FEC) decoder 1490 for decoding. As shown in FIG. 14, multiple receivers may be used for combined demodulation of multiple transmissions. The combination may occur at the FEC decoder 1490 to reduce or substantially eliminate additional processing operations. That is, if one frame is transmitted (for example, more than once), the transmitted frames may be combined just before FEC decoder 1490 as combined input to FEC decoder 1490 to save memory. The FEC decoder may reverse the coding including the puncture coding introduced by transmitter 210 at block 1490, and the descrambler 1500 may reverse the scrambling introduced by transmitter 210 to produce the source data.

According to certain exemplary embodiments of the present invention, by properly selecting puncture codes according to information indicative of the type of transmission error, a communication system having variable length frames and/or variable data rates may operate with higher BERs than using a fixed puncture code scheme, thereby improving reliability and efficiency of the communication system. Moreover, by balancing the number of bits sent by any one transmission, bandwidth requirements of the communication system may be reduced.

Although the invention has been described in terms of a UWB multi-band communication system, it is contemplated that the it may be implemented in software on microprocessors/general purpose computers (not shown). In certain embodiments, one or more of the functions of the various components may be implemented in software that controls a general purpose computer. This software may be embodied in a computer readable carrier, for example, a magnetic or optical disk, a memory-card or an audio frequency, radio-frequency, or optical carrier wave.

In addition, although the invention is illustrated and described herein with reference to specific embodiments, the invention is not intended to be limited to the details shown. Rather, various modifications may be made in the details within the scope and range of equivalents of the claims and without departing from the invention.

What is claimed is:

1. A method of communication between or among a plurality of devices in a communication system using one or more frames to transmit a plurality of bits; the method comprising the steps of:
   a) encoding the plurality of bits in accordance with a first puncture code in a first device of the plurality of devices;
   b) transmitting the plurality of encoded bits to a second device of the plurality of devices;
   c) determining in the first device an error condition indicated in a received acknowledgement from the second device;
   d) when the error condition indicates a first error code, retransmitting the encoded bits in accordance with the first puncture code;
   e) when the error condition indicates an other error code, different from the first error code, encoding the plurality of bits in accordance with a second puncture code, different from the first puncture code and retransmitting the plurality of encoded bits in accordance with the second puncture code to the second device; and
   f) selecting the first and second puncture codes by the first device such that at least one different encoded bit is transmitted when the plurality of bits are encoded with one of the first or second puncture codes relative to an other one of the first or second puncture codes,
      wherein the first and second puncture codes are configured for combined decoding of the encoded bits in the second device using encoded bits of at least the transmission and retransmission from the first device when the other error code is indicated.

2. The method of claim 1, wherein the first error code is an error related to information provided in a respective frame about at least one of a length of the respective frame or a data rate used to encode the bits in the respective frame.

3. The method of claim 1, wherein
selection of the second puncture code by the first device is based on the first puncture code.

4. The method of claim 1, further comprising the steps of:
g) determining in the first device a further error condition indicated in a further received acknowledgement from the second device; and
h) when the further error condition indicates the first error code that relates to information about at least one of a length of the respective frame or a data rate used to encode the bits, retransmitting from the first device the plurality of bits in accordance with the first puncture code; and
i) when the further error condition indicates a further code, different from the first error code, further encoding the plurality of bits using a further puncture code and retransmitting the plurality of further encoded bits.

5. The method of claim 4, further comprising the step of:
j) selecting the further puncture code based on previous puncture codes.

6. The method of claim 4, further comprising the step of:
j) selecting the further puncture code to have encoded bits that are not encoded bits of a composite of previous puncture codes.

7. A computer readable storage medium storing software that is configured to control a computer to implement the method according claim 1.

8. The method of claim 1, wherein the plurality of bits prior to encoding using either the first or second puncture codes are the same for transmission or retransmission.

9. The method of claim 1, further comprising:
combined decoding of the encoded bits of at least the transmission and retransmission from the first device when the other error code is indicated.

10. A method of communication between or among a plurality of devices in a communication system using one or more frames to transmit a plurality of bits; the method comprising the steps of:
a) encoding the plurality of bits in accordance with a first puncture code in a first device of the plurality of devices;
b) transmitting the plurality of encoded bits to a second device of the plurality of devices;
c) determining in the first device an error condition indicated in a received acknowledgement from the second device;
d) when the error condition indicates a first error code, retransmitting the encoded bits in accordance with the first puncture code;
e) when the error condition indicates an other error code, different from the first error code, encoding the plurality of bits in accordance with a second puncture code, different from the first puncture code and retransmitting the plurality of encoded bits in accordance with the second puncture code to the second device; and
f) selecting the first and second puncture codes by the first device such that at least one common encoded bit is transmitted when the plurality of encoded bits are encoded with one of the first or second puncture codes relative to an other one of the first or second puncture codes,
wherein the first and second puncture codes are configured for combined decoding of the encoded bits in the second device using encoded bits of at least the transmission and retransmission from the first device when the other error code is indicated.

11. A method of communication between or among a plurality of devices in a communication system using one or more frames to transmit a plurality of bits; the method comprising the steps of:
a) encoding the plurality of bits in accordance with a first puncture code in a first device of the plurality of devices;
b) transmitting the plurality of encoded bits to a second device of the plurality of devices;
c) determining in the first device an error condition indicated in a received acknowledgement from the second device;
d) when the error condition indicates a first error code, retransmitting the encoded bits in accordance with the first puncture code; and
e) when the error condition indicates an other error code, different from the first error code, encoding the plurality of bits in accordance with a second puncture code, different from the first puncture code and retransmitting the plurality of encoded bits in accordance with the second puncture code to the second device,
wherein:
the first and second puncture codes are configured for combined decoding of the encoded bits in the second device using encoded bits of at least the transmission and retransmission from the first device when the other error code is indicated, and
the steps (b) and (e) include transmitting a common number of the encoded bits in steps (b) and (e) such that only one of the plurality of bits is not transmitted in either step (b) or step (e).

12. The method of claim 11, further comprising the step of:
f) selecting the second puncture code to have encoded bits that are complementary to the encoded bits punctured by the first puncture code.

13. A device for communicating between or among a plurality of other devices in a communication system using one or more frames to transmit a plurality of encoded bits; the device comprising:
a) means for selecting a puncture code to be used to encode the plurality of bits;
b) an encoding unit for encoding the plurality of bits according to the selected puncture code;
c) a transmitter for transmitting the plurality of encoded bits; and
d) a receiver for receiving acknowledgements of respective transmissions of the plurality of encoded bits,
wherein:
when the means for selecting the puncture code determines that an error code in a received acknowledgement indicates a first error condition, the means for selecting the puncture code selects a first puncture code to encode the plurality of bits,
when the error code indicates an other error condition, different from the first error condition, the means for selecting the puncture code selects a second puncture code, different from the first puncture, to encode the plurality of bits,
the first and second puncture codes are configured for combined decoding of the encoded bits in the second device using encoded bits of at least two transmissions from the first device when the other error condition is indicate, and
the means for selecting the puncture code selects the first and second puncture codes such that at least one different encoded bit is transmitted when the plurality of bits are encoded with one of the first or second puncture codes relative to an other one of the first or second puncture codes.

14. The device of claim 13, wherein the means for selecting the puncture code includes one of a puncture code selection unit or a processor.

15. The device of claim 13, wherein the transmitter transmits the plurality of bits encoded in accordance with the selected first puncture code or the selected second puncture code.

16. The device of claim 13, wherein the first error condition is an error related to information provided in a respective frame about a length of the respective frame and/or a data rate used to encode the bits in the respective frame.

17. The device of claim 13, wherein the means for selecting the puncture code selects the second puncture code based on the first puncture code.

18. The device of claim 13, wherein the means for selecting the puncture code selects the second puncture code such that at least one common encoded bit is included in the transmitted plurality of bits encoded with the second puncture code relative to the transmitted plurality of bits encoded with the first puncture code.

19. The device of claim 13, wherein the means for selecting the puncture code selects the second puncture code such that bits encoded in accordance with the first puncture code are complementary to bits encoded in accordance with the second puncture code.

20. The device of claim 13, wherein when the receiver receives a further acknowledgement, the means for selecting the puncture code determines whether the further acknowledgement indicates the first error condition and when the acknowledgement indicates the first error condition, the transmitter retransmits the plurality of bits encoded in accordance with the first puncture code and when the acknowledgement indicates the other error condition, different from the first error condition, the means for selecting the puncture code selects a further puncture code to encode the plurality of bits and retransmits the plurality of bits encoded in accordance with the further puncture code.

21. The device of claim 20, wherein the means for selecting the puncture code selects the further puncture code in accordance with a number of times an error condition, other than the first error condition, has been indicated in respective received acknowledgements.

22. A method of communicating between or among a plurality of devices in a communication system using one or more frames to transmit from a first device a plurality of encoded bits, the plurality of bits being encoded in accordance with a first puncture code; the method comprising the steps of:
 a) receiving from the first device a transmission of a respective frame including the plurality of bits encoded in accordance with the first puncture code;
 b) processing in a second device the transmission of the received respective frame to determine whether an error condition is indicated therein;
 c) when the processing indicates a first error condition related to information about at least one of a length of the respective frame or a data rate used to encode the plurality of bits, transmitting from the second device a first acknowledgement message including a first error condition indicator;
 d) when the processing indicates the error condition being related to an other error condition different than the first error condition, transmitting from the second device a second acknowledgment message including a second error condition indicator different from the first error condition indicator; and
 e) after transmitting by the second device the second acknowledgement, receiving a transmission of one or more further frames, corresponding to a retransmission of the received respective frame, each of the received one or more further frames including the plurality of bits encoded in accordance with a further puncture code such that:
  (1) the first and further puncture codes are configured for combined decoding of the encoded bits in the second device using at least encoded bits of two transmissions from the first device, and
  (2) at least one different encoded bit is transmitted when the plurality of bits are encoded with one of the first or further puncture codes relative to an other one of the first or further puncture codes.

23. The method of claim 22, further comprising the step of:
 selecting each of the respective further puncture code in accordance with further acknowledgement messages.

24. The method of claim 23, wherein each first, second or further acknowledgement message includes at least one bit indicating success or failure of transmission of the information related to the length of the respective frame and at least one bit indicating success or failure of transmission of the information related to the data rate for encoding the respective frame.

25. The method of claim 22, wherein when the processing does not indicate the first error condition, decoding the respective frame by combining signals of the received respective frame and one or more further frames to increase a signal-to-noise ratio of the combined signal, the combining of the signals being based on the information about at least one of the length of the respective frame or the data rate used to encode the bits.

26. The method of claim 22, wherein each respective frame includes a header to establish the length of the respective frame and/or the data rate used to generate the encoded bits of the respective frame and a body of the respective frame to provide information about a communication, and step (b) of processing the received respective frame includes the steps of:
 computing in the second device, a cyclic redundancy check (CRC) of the header and the body; and
 comparing the computed CRC of the header with a header check sum included in the header to determine whether the first error condition is indicated, and the computed CRC of the body with a body check sum included in the body to determine whether the other error condition is indicated.

27. A method of communicating between or among a plurality of devices in a communication system, at least a portion of the plurality of devices in the communication system transmitting variable length frames in accordance with an established reservation, each respective frame including at least information indicating a length of the respective frame; the method comprising the steps of:
 a) generating a plurality of bits of the respective frame;
 b) encoding the plurality of bits in accordance with a first puncture code in a first device of the plurality of devices;
 c) transmitting the plurality of encoded bits to a second device of the plurality of devices;
 d) when a received acknowledgement from the second device indicates unsuccessful processing of information about the length of the respective frame, retransmitting the encoded bits in accordance with the first puncture code; and e) when the received acknowledgement from the second device indicates other unsuccessful processing of the respective frame different from the unsuccessful processing in step (d), encoding the plurality of bits in accordance with a second puncture code and retransmitting the encoded plurality of bits that are encoded in accordance with the second puncture code, wherein:

the first and second puncture codes are configured for combined decoding of the encoded bits in the second device using encoded bits of at least two transmissions from the first device when the other unsuccessful processing is indicated, and the steps (c) and (e) include transmitting a common number of the encoded bits in steps (c) and (e) such that only one of the plurality of bits is not transmitted in either step (c) or step (e).

28. The method of claim 27, wherein the other unsuccessful processing of the respective frame is related to a header check sum error.

29. A method of communicating between or among a plurality of devices in a communication system using a plurality of puncture codes; the method comprising the steps of:

a) encoding in a first device a plurality of bits representing a communication in accordance with N different puncture codes, as N frames of encoded bits, where N is an integer greater than 1;

b) transmitting, from the first device to a second device, a signal including the N frames of encoded bits in accordance with respective puncture codes of the N different puncture codes;

c) decoding the N frames of encoded bits to recover the plurality of bits representing the communication, wherein each of the N puncture codes has a substantially equal number of bits for transmission to reduce a bandwidth of the communication system; and d) selecting the N puncture codes by the first device such that at least one common encoded bit is transmitted for at least two transmissions corresponding to two of the N puncture codes when the plurality of encoded bits are encoded with the N different puncture codes.

30. A method of communicating between or among a plurality of devices in a communication system, at least a portion of the plurality of devices in the communication system transmitting variable length frames in accordance with an established reservation, each respective frame including at least information indicating a length of the respective frame; the method comprising the steps of:

a) generating a plurality of bits of the respective frame;

b) encoding the plurality of bits in accordance with a first puncture code in a first device of the plurality of devices;

c) transmitting the plurality of encoded bits to a second device of the plurality of devices;

d) when a received acknowledgement from the second device indicates unsuccessful processing of information about the length of the respective frame, obtaining the information about the length of the respective frame from a frame that is adjacent to the respective frame;

e) when the received acknowledgement from the second device indicates other unsuccessful processing of the respective frame different from the unsuccessful processing in step (d), encoding the plurality of bits in accordance with a second puncture code and transmitting the encoded plurality of bits that are encoded in accordance with the second puncture code; and f) selecting the first and second puncture codes by the first device such that at least one common encoded bit is transmitted when the plurality of encoded bits are encoded with one of the first or second puncture codes relative to an other one of the first or second puncture codes, wherein the first and second puncture codes are configured for combined decoding of the encoded bits in the second device using encoded bits of at least two transmissions from the first device when the other unsuccessful processing is indicated.

* * * * *